US008111071B2

US 8,111,071 B2

(12) United States Patent
Lim et al.

(10) Patent No.: US 8,111,071 B2
(45) Date of Patent: Feb. 7, 2012

(54) BATTERY MANAGEMENT SYSTEM AND DRIVING METHOD THEREOF

(75) Inventors: Gye-Jong Lim, Yongin-si (KR);
Soo-Seok Choi, Yongin-si (KR);
Young-Jo Lee, Yongin-si (KR);
Yong-Jun Tae, Yongin-si (KR);
Han-Seok Yun, Yongin-si (KR);
Se-Wook Seo, Yongin-si (KR);
Beom-Gyu Kim, Yongin-si (KR);
Ho-Young Park, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 1067 days.

(21) Appl. No.: 11/858,798

(22) Filed: Sep. 20, 2007

(65) Prior Publication Data
US 2008/0088279 A1 Apr. 17, 2008

(30) Foreign Application Priority Data
Oct. 16, 2006 (KR) .................. 10-2006-0100471

(51) Int. Cl.
*G01N 27/416* (2006.01)
*H02J 7/00* (2006.01)

(52) U.S. Cl. ........ 324/434; 324/426; 324/431; 324/433; 320/116; 320/162

(58) Field of Classification Search .................. 324/434
See application file for complete search history.

(56) References Cited

U.S. PATENT DOCUMENTS 6,236,215 B1   5/2001   Kanehira
6,639,408 B2 * 10/2003   Yudahira et al. ............. 324/434
7,471,065 B2  12/2008   Emori et al.
2002/0109506 A1  8/2002   Kawakami et al.
2003/0189412 A1* 10/2003   Cunningham ............... 315/312

(Continued)

FOREIGN PATENT DOCUMENTS
CN          1320286 A          10/2001
(Continued)

OTHER PUBLICATIONS

Patent Abstracts of Japan, Publication No. 05-281311; Date of Publication: Oct. 29, 1993; in the name of Kazuo Okada.

(Continued)

*Primary Examiner* — Edward Tso
*Assistant Examiner* — Johali Torres Ruiz
(74) *Attorney, Agent, or Firm* — Christie, Parker & Hale, LLP

(57) ABSTRACT

A sensing and control apparatus for a battery management system is provided. The sensing and control apparatus includes: a sensing unit and a main control unit. The sensing unit includes: a cell relay of a plurality of cell relays and a voltage detection unit. The cell relay is configured to be coupled to at least one of a plurality of cells. The voltage detection unit is coupled to a cell relay. The voltage detection unit is configured to: receive a reference voltage when each of the plurality of cell relays is turned off; and generate a second voltage by amplifying by a gain a first voltage that corresponds to the reference voltage. The main control unit is configured to calculate a valid gain corresponding to a ratio of the second voltage to the reference voltage when the temperature of the voltage detection unit is within a threshold temperature range.

10 Claims, 3 Drawing Sheets

U.S. PATENT DOCUMENTS

2004/0174170 A1 * 9/2004 Kim .............................. 324/426

FOREIGN PATENT DOCUMENTS

| | | |
|---|---|---|
| EP | 1 203 964 A2 | 5/2002 |
| EP | 1 763 119 A2 | 3/2007 |
| JP | 5-281311 | 10/1993 |
| JP | 8-189845 | 7/1996 |
| JP | 11-237455 | 8/1999 |
| JP | 2001-86656 | 3/2001 |
| JP | 2001-333543 | 11/2001 |
| JP | 2002-139522 | 5/2002 |
| JP | 2005-261193 | 9/2005 |
| JP | 2005-318751 | 11/2005 |
| JP | 2005-328642 | 11/2005 |
| WO | WO 2004/099791 A2 | 11/2004 |
| WO | WO 2006/110008 A1 | 10/2006 |

OTHER PUBLICATIONS

Patent Abstracts of Japan, Publication No. 2001-086656; Date of Publication: Mar. 30, 2001; in the name of Kazunobu Koga.

Patent abstracts of Japan for publication No. 2001-333543 dated Nov. 30, 2001, in the name of Koji Okamura.

JPO Notice of Allowance dated Oct. 11, 2011, for corresponding Japanese Patent Application No. 2007-265797, 2 pages.

European Search Report dated Dec. 12, 2011, for corresponding European Patent application 07118563.1, 4 pages.

Patent Abstracts of Japan, and English machine translation for Japanese Publication 2005-261193 listed above, 15 pages.

* cited by examiner

BATTERY MANAGEMENT SYSTEM AND DRIVING METHOD THEREOF

CROSS-REFERENCE TO RELATED APPLICATION

This application claims priority to and the benefit of Korean Patent Application No. 10-2006-0100471 filed in the Korean Intellectual Property Office on Oct. 16, 2006, the entire content of which is incorporated herein by reference.

BACKGROUND OF THE INVENTION

1. Field of the Invention

The present invention relates to a battery management system. More particularly, the present invention relates to a battery management system that can be used in a vehicle and a driving method thereof.

2. Description of the Related Art

Vehicles using an internal combustion engine of gasoline or heavy oil have caused serious air pollution. Accordingly, various efforts for developing electric or hybrid vehicles have recently been made to reduce air pollution.

An electric vehicle uses a battery motor operating by electrical energy output via a battery. Since the electric vehicle mainly uses a battery formed of one battery pack that includes a plurality of rechargeable/dischargeable secondary cells, there are little or no emission gases and less noise.

The term "hybrid vehicle" commonly refers to a gasoline-electric hybrid vehicle that uses gasoline to power an internal-combustion engine and an electric battery to power an electric motor. Recently, hybrid vehicles using an internal-combustion engine and fuel cells and hybrid vehicles using a battery and fuel cells have been developed. The fuel cells obtain electrical energy by generating a chemical reaction while hydrogen and oxygen are continuously provided.

A vehicle having an electric motor uses an increasing number of secondary cells to power the vehicle, and therefore, an efficient cell balance control method for a battery management system is desirable to efficiently manage a plurality of cells and a battery pack including a plurality of cells. However, the accuracy in the battery voltage measure of the battery management system is decreased due to degradation and temperature variance of the battery management system.

SUMMARY OF THE INVENTION

An embodiment of the present invention is a sensing and control apparatus for a battery management system. The battery management system is coupled to at least one of a plurality of cells. The sensing and control apparatus includes: a sensing unit including: at least one cell relay of a plurality of cell relays, the at least one cell relay being configured to be coupled to the at least one of the plurality of cells; and a voltage detection unit. The voltage detection unit is coupled to the at least one cell relay and is configured to: receive a reference voltage when each of the plurality of cell relays is turned off; and generate a second voltage by amplifying by a gain a first voltage that corresponds to the reference voltage. The sensing and control apparatus also includes: a main control unit configured to calculate a valid gain corresponding to a ratio of the second voltage to the reference voltage when a temperature of the voltage detection unit is within a threshold temperature range.

In some embodiments, the sensing unit of the sensing and control apparatus is configured to: amplify by the gain a first relay input voltage; and generate an output voltage. In some embodiments, the main control unit is configured to use the output voltage and the valid gain to detect a voltage of a first cell of the plurality of cells.

In some embodiments, the voltage detection unit includes: a first relay configured to be coupled to a first cell of the plurality of cells and to transmit the voltage of the first cell from the first relay; and a capacitor configured to store the first relay input voltage corresponding to the voltage of the first cell. The voltage detection unit also includes: a differential amplifying terminal configured to modify the first relay input voltage according to the gain and generate the output voltage; and a second relay configured to couple the capacitor and the differential amplifying terminal, wherein the reference voltage is configured to be transmitted to an input terminal of the first relay.

In some embodiments, the main control unit is configured to: calculate a first valid gain in a key-on state; compare a second valid gain in a key-off state to the first valid gain; and determine that a circuit of the voltage detection unit is not in a good state when the first valid gain does not equal the second valid gain.

In some embodiments, the threshold temperature range is a temperature range within which the gain varies according to a temperature variation of the voltage detection unit.

Another embodiment of the present invention is a driving method for operating a battery management system having a voltage detection unit for monitoring a voltage of a cell. The battery management system is configured to operate in a vehicle. The vehicle has a key-on state and a key-off state. The driving method includes: calculating a first valid gain in the key-on state; comparing the first valid gain to a second valid gain in the key-off state; and checking a circuit state of the voltage detection unit. The driving method also includes: measuring a temperature of the voltage detection unit; transmitting a reference voltage to the voltage detection unit when a measured temperature of the voltage detection unit is within a threshold temperature range; and storing a first voltage corresponding to the reference voltage. The driving method also includes: amplifying the first voltage by a resistance ratio thereby generating a second voltage; and calculating a valid gain corresponding to a ratio of the reference voltage to the second voltage.

In some embodiments, calculating the valid gain includes detecting a voltage of the first cell using an output voltage and the valid gain. In some embodiments, the driving method further includes: when the first valid gain equals the second valid gain, determining that a circuit of the voltage detection unit is in a good state; and measuring the temperature of the voltage detection unit.

In some embodiments, the threshold temperature range is a temperature range within which a gain varies according to a temperature variation of the voltage detection unit.

DETAILED DESCRIPTION OF THE EMBODIMENTS

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" or variations such as "comprises" or "comprising" will be understood to imply the inclusion of stated elements but not the exclusion of any other elements.

Figure 1:
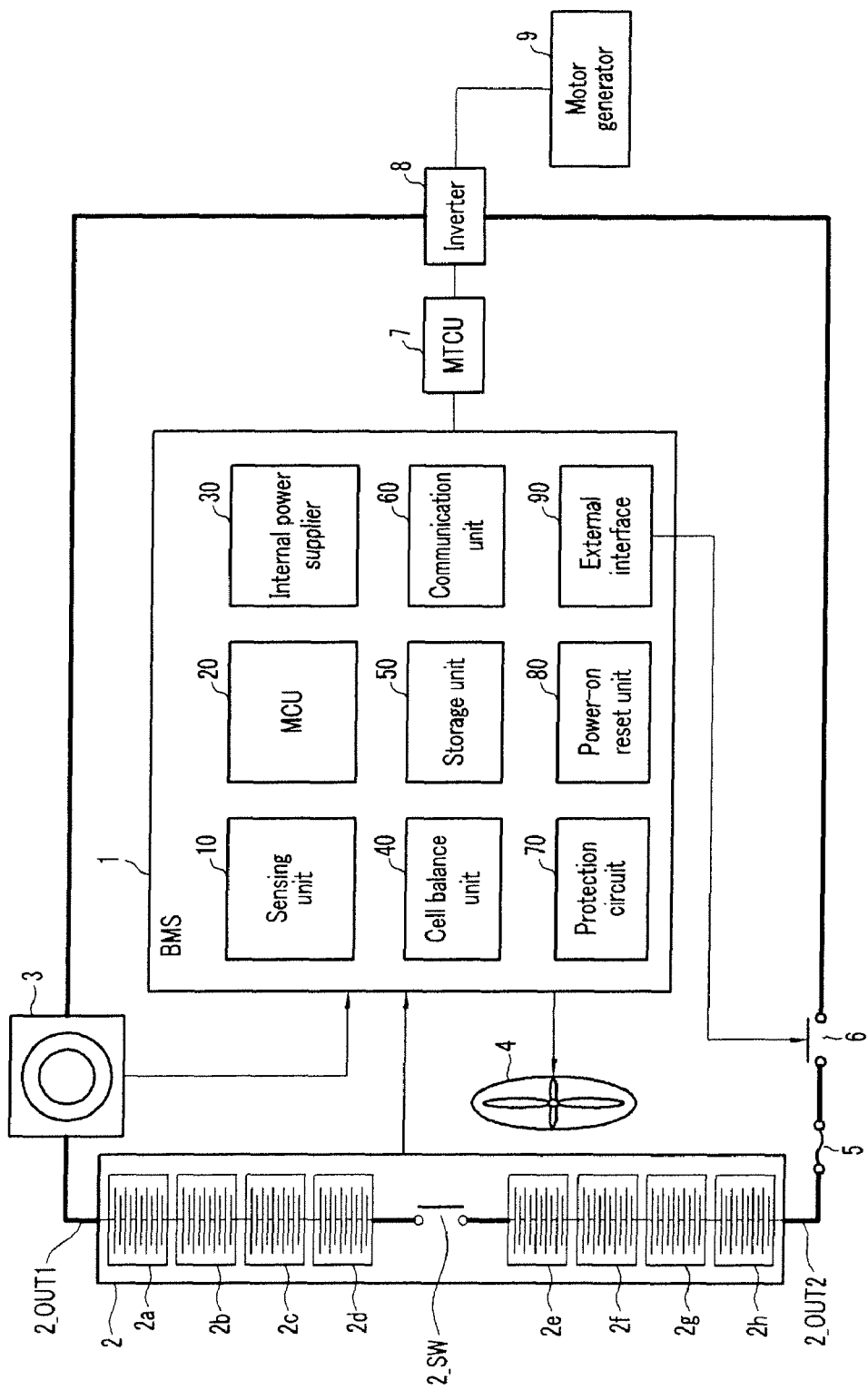
FIG. 1 shows a block diagram illustrating a hybrid electric vehicle system according to one embodiment of the present invention.

As shown in FIG. 1, the hybrid electric vehicle system according to a first embodiment of the present invention includes a battery management system (BMS) 1, a battery 2, a current sensor 3, a cooling fan 4, a fuse 5, a main switch 6, a motor control unit (MTCU) 7, an inverter 8, and a motor generator 9.

The battery 2 includes a plurality of sub-packs 2a, 2b, 2c, 2d, 2e, 2f, 2g, 2h, each having a plurality of battery cells coupled in series to each other, an output terminal 2_OUT1, an output terminal 2_OUT2, and a safety switch 2_SW provided between the sub-pack 2d and the sub-pack 2e. While eight sub-packs 2a, 2b, 2c, 2d, 2e, 2f, 2g, 2h are shown, and one sub-pack is a group of a plurality of battery cells in the embodiment of the present invention, it is not limited thereto. The safety switch 2_SW is manually turned on/off to guarantee safety for a worker when performing operations for the battery or replacing the battery. In an embodiment of the present invention, the safety switch 2_SW is provided between the sub-pack 2d and the sub-pack 2e, but is not limited thereto. The output terminal 2_OUT1 and the output terminal 2_OUT2 are coupled to the inverter 8.

The current sensor 3 measures an output current value of the battery 2 and outputs the measured output current value to the sensing unit 10 of the BMS 1. In more detail, the current sensor 3 may be a hall current transformer (Hall CT) using a hall element to measure a current value and outputting an analog current signal corresponding to the measured current value or the current sensor 3 may be a shunt resistor outputting a voltage signal corresponding to a current value through a resistor inserted on a load line.

The cooling fan 4 cools down heat generated by charging and discharging the battery 2 in response to a control signal of the BMS 1, and prevents the battery 2 from being deteriorated by a temperature increase and also prevents charging and discharging efficiency from being deteriorated.

The fuse 5 prevents an overflowing current, which may be caused by a disconnection or a short circuit of the battery 2, from being transmitted to the battery 2. That is, when the overcurrent is generated, the fuse 5 is disconnected so as to interrupt the current from overflowing.

The main switch 6 turns on/off the battery in response to the control signal of the BMS 1 or a control signal of the MTCU 7 when an unusual phenomenon, including when an overflowed voltage, an over-current, and a high temperature occurs.

The BMS 1 includes a sensing unit 10, a main control unit (MCU) 20, an internal power supplier 30, a cell balance unit 40, a storage unit 50, a communication unit 60, a protection circuit unit 70, a power-on reset unit 80, and an external interface 90.

The sensing unit 10 measures a battery voltage V, a battery current i, and a battery temperature T, and transmits the measured values to the MCU 20.

Figure 2:
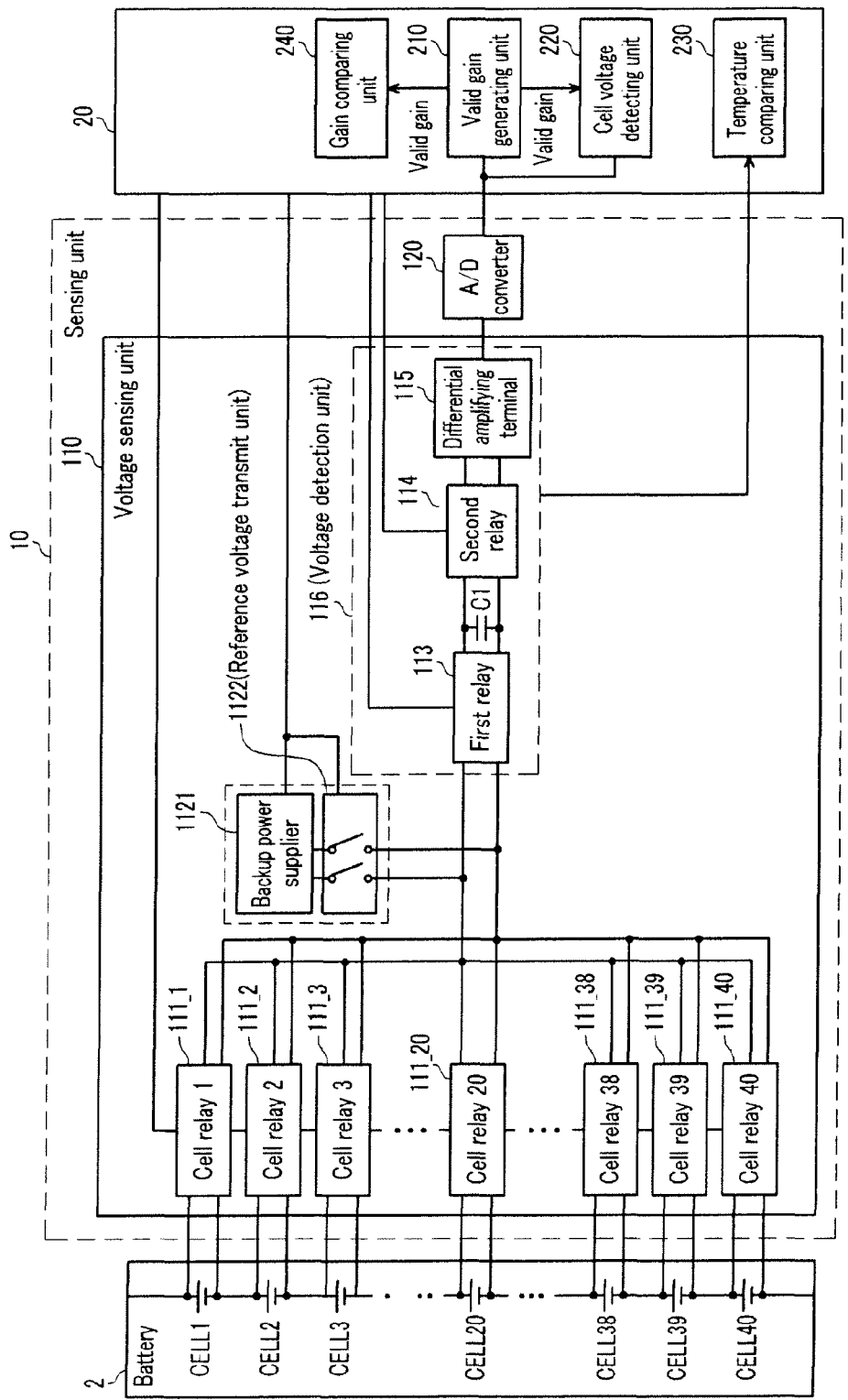
FIG. 2 shows a voltage sensing unit of a sensing unit according to one embodiment of the present invention.

FIG. 2 shows a voltage sensing unit of a sensing unit according to one embodiment of the present invention. Referring to FIGS. 1 and 2, the MCU 20 checks a circuit state of the voltage detection unit 116 and detects a cell voltage of the battery 2. The MCU 20 comprises a valid gain generating unit 210, a cell voltage detecting unit 220, a temperature comparing unit 230 and a gain comparing unit 240. The circuit state of the voltage detection unit 166 may be changed due to a disconnection or a short circuit that can occur between constituent elements of the voltage detection unit 116 according to the embodiment of the present invention. The disconnection or the short circuit can be happened due to degradation and temperature variance of the battery management system. The valid gain generating unit 210 calculates a first valid gain in a key-on state. And the gain comparing unit 240 compares the first valid gain and a second valid gain in a key-off state. As used herein, the phrase "key-on state" refers to a state when an ignition system of the electric vehicle is on. As used herein, the phrase "key-off state" refers to a state when an ignition system of the electric vehicle is off. When the first valid gain does not equal the second valid gain, the MCU 20 determines that a circuit of the voltage detection unit 116 is not in a good state and terminates a cell voltage detection process. However, when the first valid gain equals the second valid gain, the MCU 20 determines that the circuit of the voltage detection unit 116 is in a good state. The temperature comparing unit 230 measures temperature A of the voltage detection unit 116 and compares the temperature A with a threshold temperature range to determine whether or not to compensate a valid gain. When determining the threshold temperature range according to the embodiment of the present invention, an error that may result from a variation of a resistance value of a resistor of the differential amplifying terminal 115 due to temperature variation and an error that may result from deterioration due to repeated operations of constituent elements C1, 113, and 114 of the voltage detection unit 116 are taken into account, and is a temperature range within which a gain of the voltage detection unit 116 varies. When the temperature A of the voltage detection unit 116 is not included within the threshold temperature range, the MCU 20 relies on a previous valid gain that has been used until a current valid gain is calculated and detects a voltage of a cell by using the previous valid gain. However, when the temperature A of the voltage detection unit 116 is included within the threshold temperature range, the MCU 20 determines that the resistance value has been changed due to deterioration from repeated operations of constituent elements C1, 113, and 114 of the voltage detection unit 116, the valid gain generating unit 210 calculates a compensated valid gain corresponding to the changed resistance value. And the cell voltage detecting unit 220 detects the voltage of the cell by using the compensated valid gain. In addition, the MCU 20 estimates a state of charge (SOC) and a state of health (SOH) of the battery 2 based on a battery voltage V, a battery current i, and battery temperature T transmitted from the sensing unit 10.

The internal power supply unit 30 supplies power to the BMS 1 by using a backup battery. The cell balance unit 40 balances the state of charge of each cell. That is, cells sufficiently charged are discharged, and cells relatively less charged are further charged. The storage unit 50 stores data of the current SOC and SOH when the power source of the BMS 1 is turned off. Here, an electrically erasable programmable read-only memory (EEPROM) may be used for the storage unit 50. The communication unit 60 communicates with the MTCU 7 of the vehicle. The communication unit 60 transmits SOC information and SOH information to the MTCU 7 from the BMS 1 or receives vehicle state information from the MTCU 7 and forwards the vehicle state information to the MCU 20. The protection circuit unit 70 uses firmware to protect the battery 2 from shocks, over-flowed currents, and low voltages. The power-on reset unit 80 resets the overall system when the power source of the BMS 1 is turned on. The external interface 90 couples auxiliary devices for the BMS, such as the cooling fan 4 and main switch 6, to the MCU 20. While the cooling fan 4 and the main switch 6 are shown as BMS assistance devices in the embodiment of the present invention, it is not limited thereto.

The MTCU 7 checks a current operation state of the vehicle based on information of an accelerator, a break, and a vehicle speed, and determines a required torque state.

In more detail, the current operation state of the vehicle may be a state of a key-on that starts an engine, a state of a key-off that stops the engine, constant velocity and/or acceleration. The MTCU 7 transmits vehicle state information to the communication unit 60 of the BMS 1. The MTCU 7 controls an output of the motor-generator 9 corresponding to the torque information. That is, the MTCU 7 controls a switching operation of the inverter 8 and controls the output of the motor generator 9 so that the output corresponds to the torque information. In addition, the MTCU 7 receives the SOC of the battery 2 from the MCU 20 through the communication unit 60, and controls the SOC level of the battery 2 to be a target level (e.g., 55%).

For example, when the SOC level transmitted from the MCU 20 is lower than 55%, the MTCU 7 controls a switch of the inverter 8 so as to output power toward the battery 2 and charge the battery 2. In this case, the battery pack current is a positive value (+). When the SOC level is greater than 55%, the MTCU 7 controls the switch of the inverter 8 to output the power toward the motor generator 9 and discharge the battery 2. In this case, the battery pack current I is a negative value (−).

The inverter 8 controls the battery 2 to be charged or discharged in response to the control signal of the MTCU 7.

The motor generator 9 uses the electrical energy of the battery to drive the vehicle based on the torque information transmitted from the MTCU 7.

Accordingly, since the MTCU 7 charges and discharges the battery 2 based on the SOC level to prevent the battery 2 from being overcharged or over-discharged, the battery 2 may be efficiently used for a long time. However, since it is difficult to measure an actual SOC level of the battery 2 when the battery 2 is mounted on the vehicle, the BMS 1 may estimate the SOC level by using the battery voltage, battery current, and battery temperature sensed by the sensing unit 10 and to transmit the estimated SOC to the MTCU 7.

A battery voltage detection process according to the embodiment of the present invention will be described in further detail with reference to FIG. 2 and FIG. 3.

Figure 3:
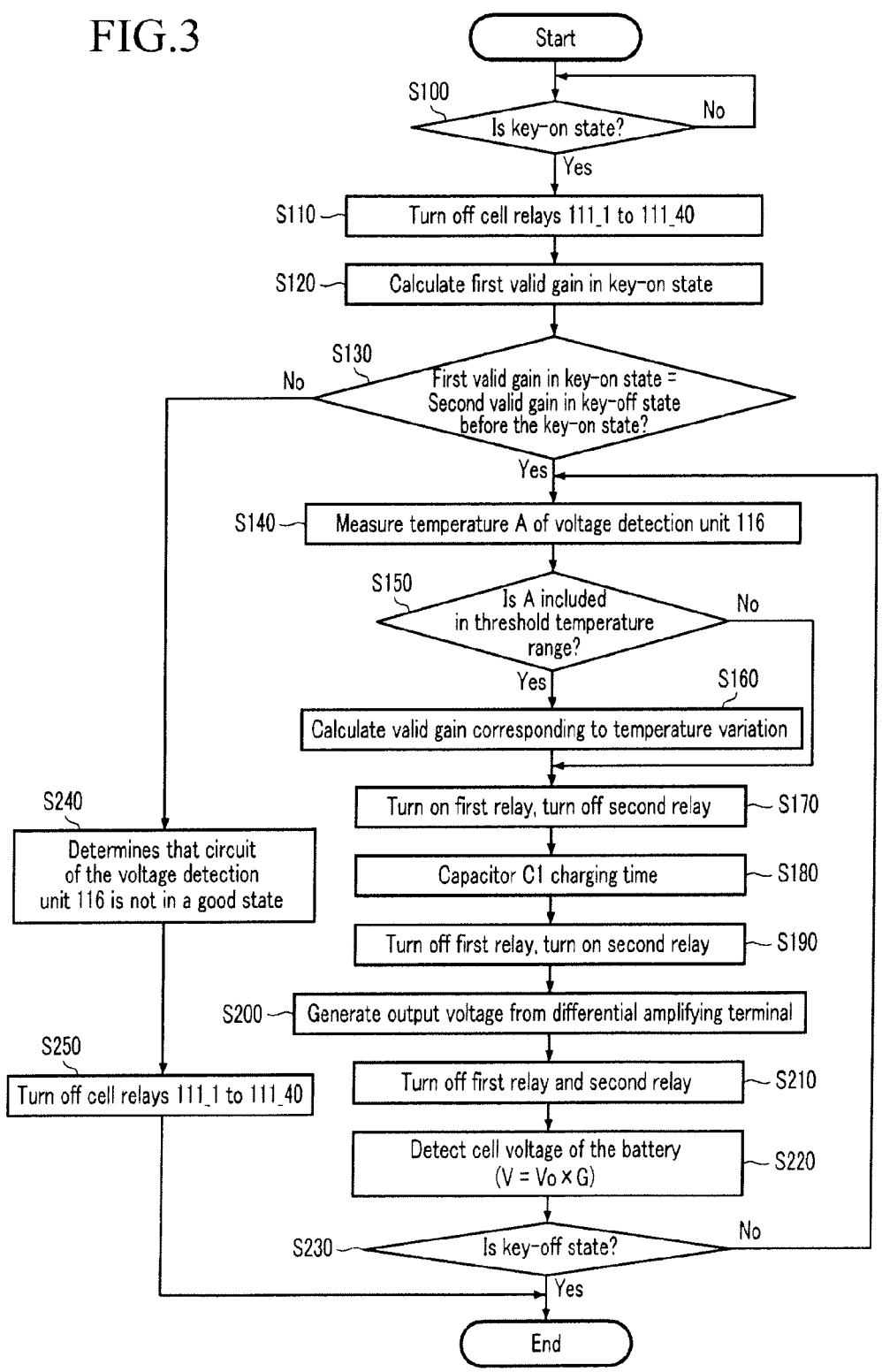
FIG. 3 shows a flowchart of a battery voltage detection process according to one embodiment of the present invention.

In FIG. 2 and FIG. 3, the threshold temperature range is determined while taking an error resultant from a variation of a resistance value of a resistor of the differential amplifying terminal 115 due to temperature variation and an error resultant from deterioration due to repeated operations of constituent elements C1, 113, and 114 of the voltage detection unit 116 into account. The threshold temperature range is a temperature range within which a gain of the voltage detection unit varies. In addition, the threshold temperature range is compared with periodically measured temperature A the voltage detection unit 116, and a valid gain of the voltage detection unit 116 is determined in accordance with the comparison result.

As shown in FIG. 2, the voltage sensing unit 110 includes cell relays 111_1 to 111_40, a backup power supplier 1121, a reference voltage transmit unit 1122, a first relay 113, a second relay 114, a capacitor C1, and a differential amplifying terminal 115. The voltage sensing unit receives a control signal from the MCU 20. A control signal generated by the MCU 20 and transmitted to the voltage sensing unit 110 will be described in more detail. The MCU 20 generates a first control signal and transmits the first control signal to the cell relays 111_1 to 111_40 so as to control the cell relays 111_1 to 111_40. The cell relays 111_1 to 111_40 sequentially couple a plurality cells of the battery 2 and the voltage detection unit 116 responding to the first control signal. The MCU 20 generates a second control signal and transmits the second control signal to the reference voltage transmit unit 1122 so as to control the reference voltage transmit unit 1112. The reference voltage transmit unit 1122 transmits a reference voltage Vref of the backup power supplier 1121 to the voltage detection unit 116 responding to the second control signal.

In addition, the MCU 20 generates a third control signal and transmits the third control signal to the first relay 113 so as to control the first relay 113. The first relay 113 transmits an input voltage applied to the voltage detection unit 116 to a capacitor C1 responding to the third control signal. In addition, the MCU 20 generates a fourth control signal and transmits the fourth control signal to the second relay 114 so as to control the second relay 114. The second relay 114 transmits the voltage stored in the capacitor C1 to the differential amplifying terminal 115 responding to the fourth control signal. The meaning of the term "amplifying" in the term "differential amplifying terminal" 115 according to the embodiment of the present invention includes "increase" and "decrease" of a voltage.

In addition, an output voltage of the differential amplifying terminal 115 may increase or decrease depending on a gain value, and the term "differential amplifying" is used for better understanding. The differential amplifying terminal 115, including at least one resistor, amplifies an input voltage according to a resistance ratio of the resistor and generates an output voltage. The resistance ratio of the at least one resistor of the differential amplifying terminal 115 will be defined as a "gain" in the following description, and a value calculated by dividing an output voltage Vout of the voltage detection unit 116 with an input voltage Vin of the voltage detection unit 116 is defined as a "valid gain". That is, a valid gain corresponds to a ratio (Vout/Vin) of the input voltage Vin and the output voltage Vout.

The cell relays 111_1 to 111_40 are each coupled to a positive terminal and a negative terminal of each cell. In addition, cell relays 111_1 to 111_40 transmits a cell voltage of the battery 2 to the voltage detection unit 116 responding to the first control signal of the MCU 20.

The reference voltage transmit unit 1122 is controlled in accordance with the second control signal, and transmits a reference voltage Vref of the backup power supplier 1121 to the voltage detection unit 116 responding to the second control signal. The reference voltage transmit unit 1122 according to the embodiment of the present invention may include a relay turned on in response to the second control signal, and in this case, a voltage level of the second control signal determines turning on of the relay. Herein, the reference voltage Vref of the backup power supplier 1121 is transmitted to the voltage detection unit 116 to determine a circuit state of the voltage detection unit 116 and to calculate a valid gain according to a variation of temperature A of the voltage detection unit 116.

The voltage detection unit 116 includes the capacitor C1, the first relay 113, the second relay 114, and the differential amplifying terminal 115. The voltage detection unit receives a control signal from the MCU 20. The manner in which the voltage detection unit 116 operates in response to the control signal will be described in further detail. After receiving the third control signal, the first relay 113 transmits to capacitor C1 the input voltage transmitted to the voltage detection unit 116. The capacitor C1 stores a voltage corresponding to the input voltage. In this case, the second relay 114 transmits the voltage stored in the capacitor C1 to the differential amplifying terminal 115, responding to the fourth control signal. The differential amplifying terminal 115 amplifies the voltage according to a gain and generates an output voltage.

An analog/digital (A/D) converter 120 converts the output voltage transmitted from the differential amplifying terminal 115 into digital data and transmits the digital data to the MCU 20.

A process for detecting a voltage of a cell CELL20 of the battery 2 when the battery 2 is in a key-on state will be described. The MCU 20 calculates a first valid gain in the key-on state and compares the first valid gain with a second valid gain in a key-off state before the key-on state so as to check a circuit state of the voltage detection unit 116. The MCU 20 detects a voltage of the cell CELL20 when the battery 2 is in the key-on state. In order to calculate the first valid gain in the key-on state, the reference voltage transmit unit 1122 transmits the reference voltage Vref of the backup power supplier 1121 to the voltage detection unit 116, responding to the second control signal.

The voltage detection unit 116 amplifies the reference voltage Vref according to a gain, generates an output voltage and transmits the output voltage to the MCU 20. In this case, the MCU 20 divides the output voltage with the reference voltage Vref and calculates the first valid gain in the key-on state. In addition, the MCU 20 compares the first valid gain in the key-on state and the second valid gain in the key-off state. When the first valid gain does not equal the second valid gain, the MCU 20 determines that the circuit of the voltage detection unit 116 is not in a good state and terminates detection of a cell voltage of the battery 2 by turning off the cell relays 111_1 to 111_40 coupled to the battery 2.

However, when the first valid gain in the key-on state equals the second valid gain in the key-off state, the MCU 20 determines that the circuit of the voltage detection unit 116 is in a good state and measures temperature A of the voltage detection unit 116. In addition, the MCU 20 compares the measured temperature A with a threshold temperature range and determines whether or not to compensate a valid gain.

In this case, when the temperature A of the voltage detection unit 116 is not included within the threshold temperature range, the MCU 20 relies on the previous valid gain that existed until the current valid gain was calculated, and detects a voltage of the cell CELL20 of the battery 20 by using the current valid gain.

However, when the temperature A of the voltage detection unit 116 is included within the threshold temperature range, the MCU 20 determines that a resistance value has been changed due to degradation caused by repeated operations of a resistor of the differential amplifying terminal 115 and peripheral elements C1, 113, and 114 of the voltage detection unit 116, and calculates a valid gain corresponding to the changed resistance value. In this case, the MCU 20 transmits the first control signal to the cell relay 20 111_20 to detect a voltage of the cell CELL20 of the battery 2.

The cell relay 20 111_20 is turned on, and the voltage of the cell CELL20 is transmitted to the voltage detection unit 116. At this time, the MCU 20 transmits the third control signal to the voltage detection unit 116 and turns on the first relay 113. The turned-on first relay 113 transmits the voltage of the cell CELL20 transmitted to the voltage detection unit 116 to the capacitor C1. The capacitor C1 stores a voltage that corresponds to the transmitted voltage of the cell CELL20 for a time (e.g., a predetermined time). The MCU 20 transmits the fourth control signal to the voltage detection unit 116 and turns on the second relay 114. The turned-on second relay 114 transmits the voltage stored in the capacitor C1 to the differential amplifying terminal 115. The differential amplifying terminal 115 amplifies the voltage according to a gain, generates an output voltage, and transmits the output voltage to the A/D converter 120. The A/D converter 120 converts the output voltage into digital data and transmits the digital data to the MCU 20. The MCU 20 receives the output voltage and divides the output voltage by the valid gain to detect the voltage of the cell CELL20 of the battery 2.

The reference voltage Vref is transmitted to an input terminal of the voltage detection unit 116, and whether a circuit of the voltage detection unit 116 is damaged due to disconnection or short circuit is determined by using the reference voltage Vref, and accordingly, an error that may occur in the cell voltage detection can be reduced and a more accurate cell voltage can be detected.

FIG. 3 is a flowchart of a battery voltage detection process according to the embodiment of the present invention.

The MCU 20 checks S100 whether the battery 2 is in the key-on state. When the battery 2 is not in the key-on state, the MCU 20 repeats S100. When a result of checking S100 shows that the battery 2 is in the key-on state, the MCU 20 transmits the first control signal and turns off S110 the cell relays 111_1 to 111_40. In this case, the reference voltage transmit unit 1122 transmits the reference voltage Vref of the backup power supplier 1121 to the voltage detection unit 116, responding to the second control signal. The voltage detection unit 116 amplifies a voltage that corresponds to the reference voltage Vref according to a gain, generates an output voltage, and transmits the output voltage to the MCU 20. The MCU 20 divides the output voltage with the reference voltage Vref and calculates S120 the first valid gain in the key-on state.

The MCU 20 compares S130 the calculated first valid gain and the second valid gain in the key-off state before the key-on state. When a result of the comparison of S130 shows that the first valid gain does not equal the second valid gain, the MCU 20 determines S240 that the circuit of the voltage detection unit 116 is not in a good state. The MCU 20 transmits the first control signal, turns off S250 the cell relays 111_1 to 111_40, and terminates cell voltage detection. When the result of the comparison of S130 shows that the first valid gain equals the second valid gain, the MCU 20 measures S140 temperature A of voltage detection unit 116. The MCU 20 compares S150 the measured temperature A of the voltage detection unit 116 and the threshold temperature range.

When a result of the comparison in S150 shows that the measured temperature A is not included in the threshold temperature range, the MCU 20 relies on a current valid gain, and turns on the cell relays 111_1 to 111_40 corresponding to a cell from which a voltage is to be detected and transmits a voltage of the cell to the voltage detection unit 116. The MCU 20 turns on S170 first relay 113 and turns off the second relay 114, and stores a voltage corresponding to the voltage of the cell transmitted from the MCU 20 in the capacitor C1. After a selected time for storing the voltage in the capacitor C1 has passed S180, the MCU 20 turns off S190 the first relay 113, turns on the second relay 114, and transmits the voltage stored in the capacitor C1 to the input terminal of the differential amplifying terminal 115. The differential amplifying terminal 115 amplifies the voltage transmitted from the MCU 20 according to a gain and generates S200 an output voltage.

In addition, when the output voltage is detected by the differential amplifying terminal 115, MCU 20 transmits the third and fourth control signals and turns off S219 the first relay 113 and the second relay 114. The MCU 20 divides the output voltage with a valid gain and detects S220 a voltage of the cell CELL20 of the battery 2. The MCU 20 checks S230 whether the battery 2 is in the key-off state. When a result of the checking in S230 shows that the battery 2 is in the key-off state, the MCU 20 terminates the battery voltage detection process. When the result of the checking in S230 shows that the battery 2 is not in the key-off state, the MCU 20 returns to S140 and detects a cell voltage of the next battery.

When a result of the comparison in S150 shows that the temperature A is included within the threshold temperature range, the MCU 20 determines that a resistance value has been changed due to degradation caused by repeated operations of a resistor of the differential amplifying terminal 115 and peripheral elements C1, 113, and 114 of the voltage detection unit 116, and calculates a valid gain corresponding to the changed resistance value. A valid gain is calculated in accordance with the temperature variation in step S160. The MCU 20 transmits the first control signal and turns off the cell relays 111_1 to 111_40. The reference voltage transmit unit 1122 transmits the reference voltage Vref of the backup power supplier 1121 to the voltage detection unit 116, responding to the second control signal. The voltage detection unit 116 amplifies the reference voltage Vref according to a resistance ratio of the resistor and generates an output voltage, and transmits the output voltage to the MCU 20.

Herein, the resistance ratio is changed due to degradation caused by repeated operations of the resistor of the differential amplifying terminal 115 and peripheral elements C1, 113, and 114 of the voltage detection unit 116. The MCU 20 divides the output voltage with the reference voltage Vref and calculates S160 a valid gain.

In addition, the MCU 20 turns on the cell relays 111_1 to 111_40 corresponding to a cell of which a voltage is to be detected and transmits the voltage of the cell to the voltage detection unit 116. In addition, the MCU 20 turns on S170 the first relay 113, turns off the second relay 114, and stores a voltage corresponding to the voltage of the cell in the capacitor C1. After a selected time S180 for storing the voltage that corresponds to the voltage transmitted through the turned-on first relay 113, the MCU 20 turns off S190 the first relay 113, turns on the second relay 114 and transmits the voltage stored in the capacitor C1 to the input terminal of the differential amplifying terminal 115.

The differential amplifying terminal 115 amplifies the voltage according to a gain and generates S200 an output voltage. When the output voltage is detected from the differential amplifying terminal 115, the MCU 20 transmits the third and the fourth control signals and turns off S210 the first relay 113 and the second relay 114.

The MCU 20 divides the output voltage with the valid gain that has been calculated in accordance with temperature variation, and detects S220 a voltage of the cell of the battery. The MCU 20 checks S230 whether the battery 2 is in the key-off state and terminates the battery voltage detection process when the battery 2 is in the key-off state. When the battery 2 is not in the key-off state in S230, the MCU 20 returns to S140 and calculates a cell voltage of the next battery.

According to the embodiment of the present invention, the number of cells in the battery is set to 40, but it is not restrictive. Additionally, other numbers of cells forming a battery may be used. Also, the number of cell relays can be controlled in correspondence with the number of cells forming the battery. In addition, output terminals of the cell relays 111_1 to 111_40 corresponding to the number of cells of the battery are coupled with each other, and the output terminals are sequentially coupled to the backup power supplier 1121 and the voltage detection unit 116 so that a cell voltage of the battery can be calculated. In addition, a valid gain is calculated in accordance with temperature variation of the voltage detection unit 116, the voltage of the battery cell is detected by using the valid gain. Accordingly, a voltage of the battery cell can be more accurately detected.

As described, the battery management system and the driving method of the battery management system according to the embodiment of the present invention calculate a valid gain according to temperature variation of the voltage detection unit, detect a cell voltage of the battery by using the valid gain, and accordingly, a cell voltage of the battery can be more accurately detected.

While embodiments of this invention are described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A sensing and control apparatus for a battery management system coupled to at least one of a plurality of cells, the sensing and control apparatus comprising:
a sensing unit including:
at least one cell relay of a plurality of cell relays, the at least one cell relay being configured to be coupled to the at least one of the plurality of cells; a voltage detection unit comprising a first relay coupled to the at least one cell relay, the voltage detection unit being configured to:
receive a reference voltage when each of the plurality of cell relays is turned off; and
generate a second voltage by amplifying by a gain a first voltage that corresponds to the reference voltage; and
a reference voltage transmit unit coupled to a connection point between the first relay and the at least one cell relay; and
a main control unit configured to calculate a valid gain corresponding to a ratio of the second voltage to the reference voltage when a temperature of the voltage detection unit is within a threshold temperature range.

2. The sensing and control apparatus of claim 1, wherein the threshold temperature range is a temperature range within which the gain varies according to a temperature variation of the voltage detection unit.

3. The sensing and control apparatus of claim 1, wherein the sensing unit is configured to:
amplify by the gain a first relay input voltage; and
generate an output voltage.

4. The sensing and control apparatus of claim 3, wherein the threshold temperature range is a temperature range within which the gain varies according to a temperature variation of the voltage detection unit.

5. The sensing and control apparatus of claim 3, wherein the main control unit is configured to use the output voltage and the valid gain to detect a voltage of a first cell of the plurality of cells.

6. The sensing and control apparatus of claim 5, wherein the threshold temperature range is a temperature range within which the gain varies according to a temperature variation of the voltage detection unit.

7. The sensing and control apparatus of claim 5, wherein the voltage detection unit further comprises:
a capacitor configured to store the first relay input voltage corresponding to the voltage of the first cell;

a differential amplifying terminal configured to modify the first relay input voltage according to the gain and generate the output voltage; and a second relay configured to couple the capacitor and the differential amplifying terminal, wherein the reference voltage is configured to be transmitted to an input terminal of the first relay, wherein the first relay is configured to be coupled to the first cell of the plurality of cells and to transmit the voltage of the first cell from the first relay.

8. The sensing and control apparatus of claim 7, wherein the threshold temperature range is a temperature range within which the gain varies according to a temperature variation of the voltage detection unit.

9. The sensing and control apparatus of claim 7, wherein the main control unit is configured to:

calculate a first valid gain in a key-on state;

compare a second valid gain in a key-off state to the first valid gain; and determine that a circuit of the voltage detection unit is not in a good state when the first valid gain does not equal the second valid gain.

10. The sensing and control apparatus of claim 9, wherein the threshold temperature range is a temperature range within which the gain varies according to a temperature variation of the voltage detection unit.

* * * * *